US010976960B2

(12) United States Patent
Prather et al.

(10) Patent No.: US 10,976,960 B2
(45) Date of Patent: *Apr. 13, 2021

(54) METHODS OF SYNCHRONIZING MEMORY OPERATIONS AND MEMORY SYSTEMS EMPLOYING THE SAME

(71) Applicant: Micron Technology, Inc., Boise, ID (US)

(72) Inventors: Matthew A. Prather, Boise, ID (US); Frank F. Ross, Boise, ID (US)

(73) Assignee: Micron Technology, Inc., Boise, ID (US)

(*) Notice: Subject to any disclaimer, the term of this patent is extended or adjusted under 35 U.S.C. 154(b) by 37 days.

This patent is subject to a terminal disclaimer.

(21) Appl. No.: 16/212,572

(22) Filed: Dec. 6, 2018

(65) Prior Publication Data
US 2019/0107975 A1  Apr. 11, 2019

Related U.S. Application Data

(63) Continuation of application No. 15/693,128, filed on Aug. 31, 2017, now Pat. No. 10,282,134.

(51) Int. Cl.
G06F 12/00 (2006.01)
G06F 3/06 (2006.01)
G06F 13/16 (2006.01)
G11C 7/22 (2006.01)

(52) U.S. Cl.
CPC .......... G06F 3/0659 (2013.01); G06F 3/0611 (2013.01); G06F 3/0683 (2013.01); G06F 13/1689 (2013.01); G11C 7/22 (2013.01); G11C 7/222 (2013.01)

(58) Field of Classification Search
None
See application file for complete search history.

(56) References Cited

U.S. PATENT DOCUMENTS

| 10,282,133 | B2 | 5/2019 | Prather |
| 10,282,134 | B2* | 5/2019 | Prather ................. G06F 3/0659 |
| 2012/0117338 | A1* | 5/2012 | Vaidyanath ......... G06F 13/1689 711/154 |
| 2013/0039128 | A1* | 2/2013 | Amidi ................ G11C 14/0009 365/185.08 |
| 2015/0286405 | A1 | 10/2015 | Chang et al. |
| 2019/0107974 | A1 | 4/2019 | Prather |
| 2019/0355434 | A1 | 11/2019 | Liikanen et al. |

* cited by examiner

Primary Examiner — Daniel D Tsui
(74) Attorney, Agent, or Firm — Perkins Coie LLP

(57) ABSTRACT

A memory system is provided. The memory system includes a first memory device having a first latency corresponding to a first command and a second memory device having a second latency corresponding to a second command. The second latency differs from the first latency by a latency difference. The memory system further includes a host operably coupled to the first and second memory devices. The host is configured to send the first command to the first memory device at a first time, and to send the second command to the second memory device at a second time. The first time and the second time are separated by a delay corresponding to the latency difference.

14 Claims, 3 Drawing Sheets

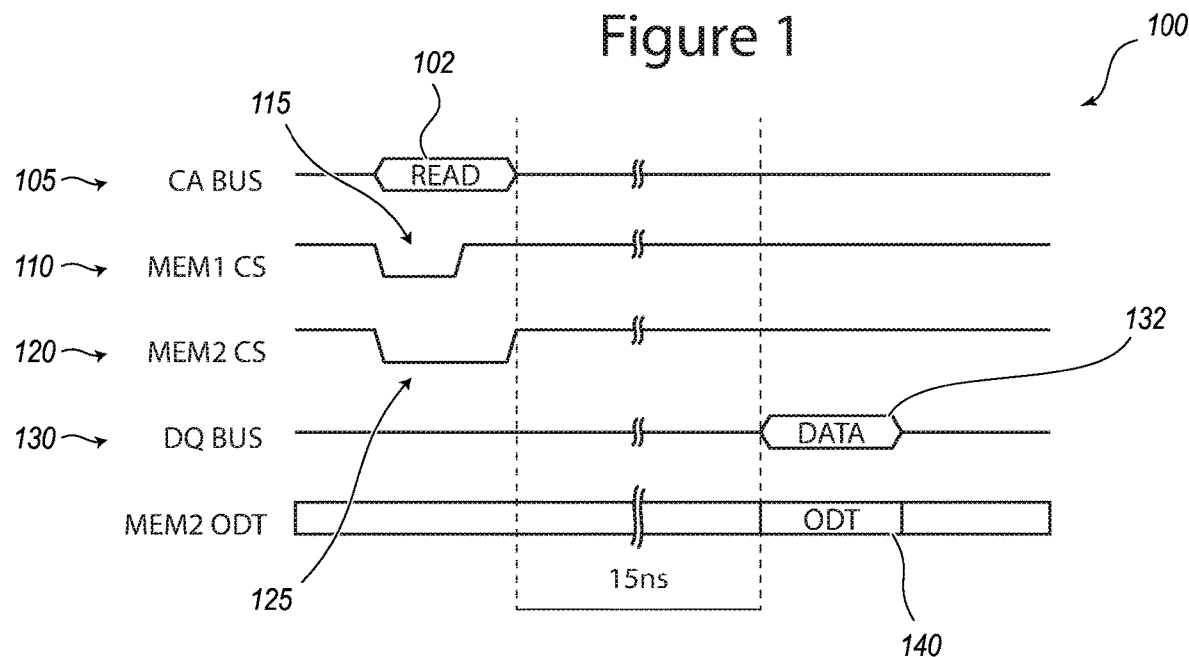
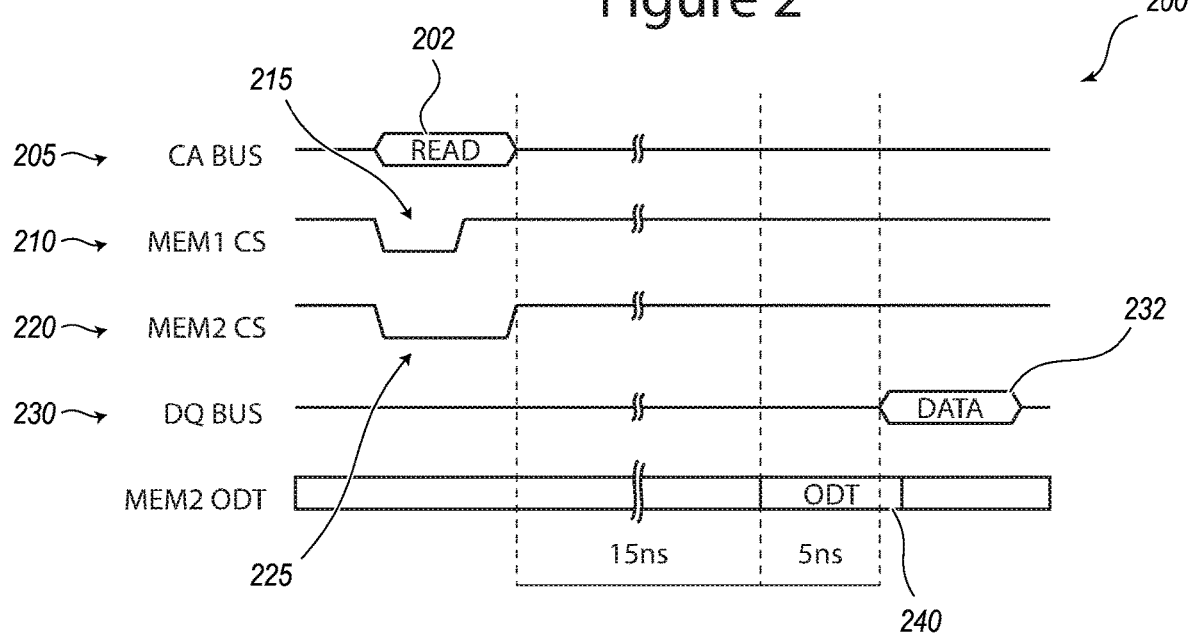

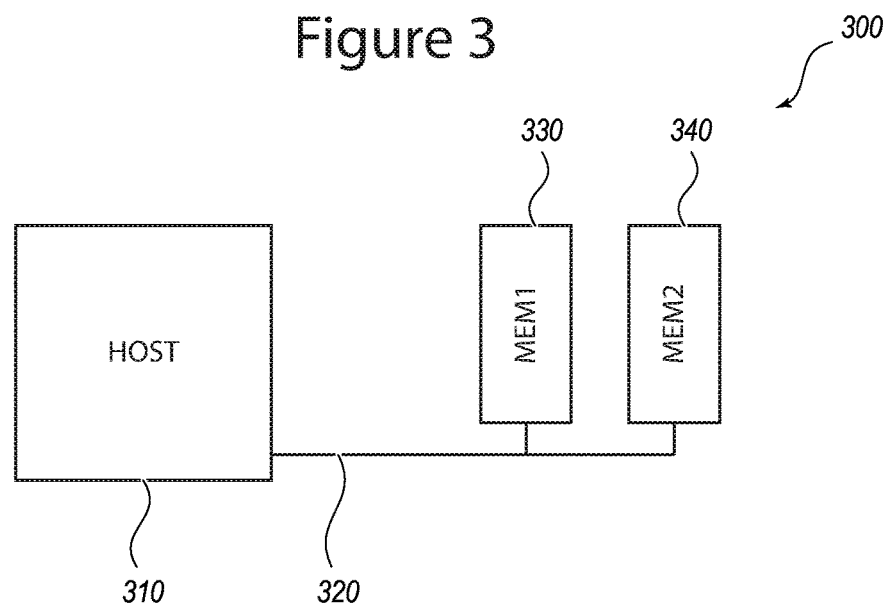
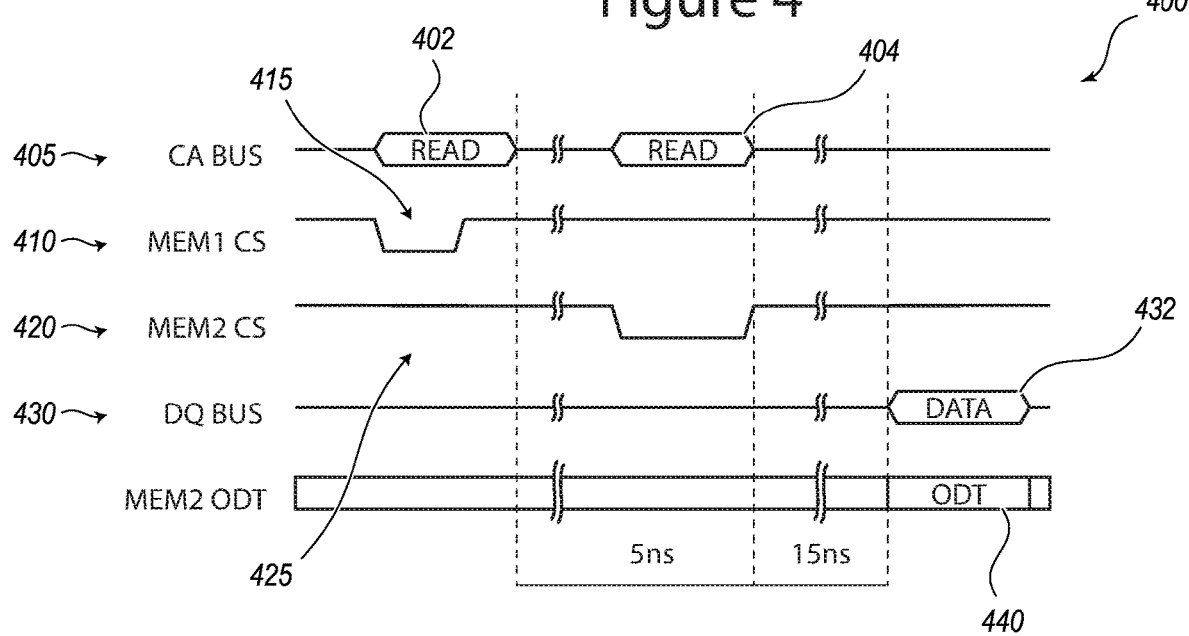

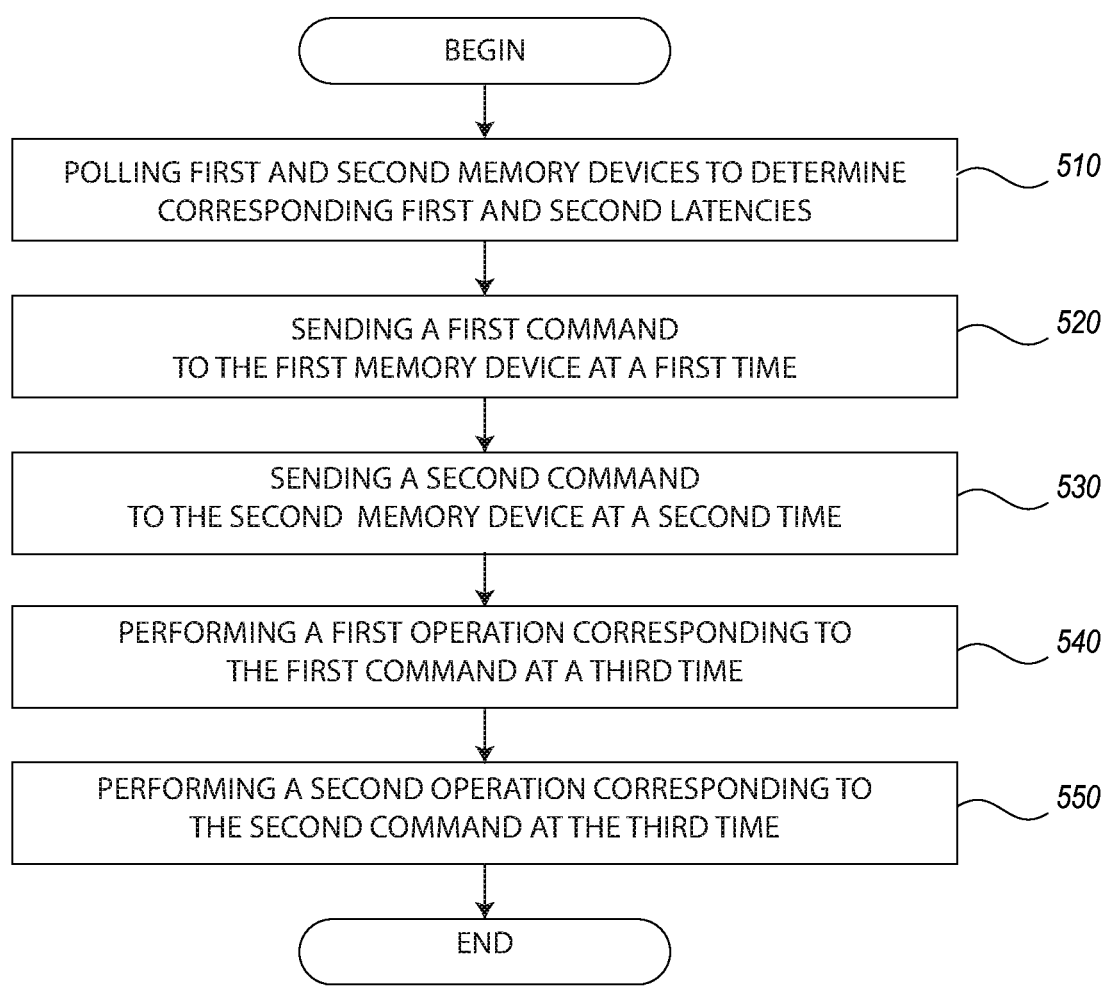

METHODS OF SYNCHRONIZING MEMORY OPERATIONS AND MEMORY SYSTEMS EMPLOYING THE SAME

CROSS-REFERENCE TO RELATED APPLICATION(S)

This application is a continuation of U.S. application Ser. No. 15/693,128, filed Aug. 31, 2017, which is incorporated herein by reference in its entirety.

This application contains subject matter related to an U.S. Patent Application by Matthew A. Prather, entitled "MEMORY DEVICES WITH PROGRAMMABLE LATENCIES AND METHODS FOR OPERATING THE SAME." The related application, of which the disclosure is incorporated by reference herein, is assigned to Micron Technology, Inc., and is identified as U.S. application Ser. No. 15/693,095, filed Aug. 31, 2017.

TECHNICAL FIELD

The present disclosure generally relates to memory systems, and more particularly relates to methods of synchronizing memory operations and memory systems employing the same.

BACKGROUND

In memory systems with multiple memory devices operably coupled to a shared memory bus, it is frequently advantageous to synchronize the performance of various memory operations among the memory devices. For example, in a memory system in which multiple memory modules are connected to a single memory bus, it may be beneficial to synchronize a data transfer operation in one memory module with a termination mode in the other memory modules, so that the impedance is properly controlled for best signal quality during the data transfer operation.

One way to provide such synchronization is to provide memory systems with multiple memory devices that all have the same latencies in response to corresponding memory commands, so that a single command can be made on the command/address bus to command one of the memory devices to perform a data transfer operation (e.g., a read or a write operation) at the same time as the other devices are placed into a termination mode (e.g., by utilizing different chip select signals to indicate which memory device is the target of the read operation, and which are non-targets that should be placed in a termination mode). This approach, however, is limited to systems in which all of the memory devices on the shared memory bus have the same latency in response to a given command (e.g., in which the latency between the first memory device receiving a data transfer command and performing a corresponding data transfer operation is the same as the latency between the remaining memory devices receiving the termination mode command and entering a termination mode). Accordingly, it is desirable to provide improved methods of synchronizing memory operations and memory systems that employ the same.

BRIEF DESCRIPTION OF THE DRAWINGS

FIG. 1 is a timing diagram illustrating synchronized memory operations in a memory system with memory devices having matched latencies.

FIG. 2 is a timing diagram illustrating out-of-sync memory operations in a memory system with memory devices having mis-matched latencies.

FIG. 3 is a block diagram schematically illustrating a memory system in accordance with an embodiment of the present technology.

FIG. 4 is a timing diagram illustrating synchronized memory operations in a memory system with memory devices having different latencies, in accordance with an embodiment of the present technology.

FIG. 5 is a flow chart illustrating a method of operating a memory system in accordance with an embodiment of the present technology.

DETAILED DESCRIPTION

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

FIG. 1 is a timing diagram 100 illustrating synchronized memory operations in a memory system with memory devices having matched latencies. As can be seen with reference to FIG. 1, in a memory system in which the memory devices on a shared memory bus have matched latencies, a single command (e.g., the read command 102 on CA bus 105) can be used to both (i) command a first one of the memory devices (e.g., with a target signal 115 on the chip select line 110 of the first memory device) to perform a data transfer operation and (ii) command a second one of the memory devices (e.g., with a non-targeted signal 125 on the chip select line 120 of the second memory device) to enter a termination mode (e.g., an on-die termination ("ODT") mode). In such a memory system, where the delay between the read command 102 and the read operation 132 at the first memory device (e.g., illustrated as a data packet on the data bus 130) is the same as the delay between the read command 102 and the activation of the ODT mode 140 at the second memory device (e.g., the 15 ns illustrated in timing diagram 100), synchronization of the memory operations can be achieved with a single command.

In a memory system in which multiple memory devices on a shared memory bus have different latencies, however, the foregoing approach will not function well. This can be seen with reference to FIG. 2, which illustrates a timing diagram 200 corresponding to one such memory system. In a memory system in which the memory devices on a shared memory bus have different latencies (e.g., the 5 ns difference illustrated in timing diagram 200), utilizing a single command (e.g., the read command 202 on CA bus 205) to both (i) command a first one of the memory devices (e.g., with a target signal 215 on the chip select line 210 of the first memory device) to perform a data transfer operation and (ii) command a second one of the memory devices (e.g., with a non-targeted signal 225 on the chip select line 220 of the second memory device) to enter a termination mode (e.g., an ODT mode) will cause the read operation 232 at the first memory device (e.g., illustrated as a data packet on the data bus 230) and the ODT mode 240 of the second memory device to occur at different times (e.g., separated by 5 ns).

Accordingly, several embodiments of memory systems in accordance with the present technology can provide synchronization of memory operations that overcomes the limitations of conventional memory systems. Several embodiments of the present technology are directed to a memory system comprising a first memory device having a first latency corresponding to a first command and a second memory device having a second latency corresponding to a second command. The second latency differs from the first latency by a latency difference. The memory system further comprises a host operably coupled to the first and second memory devices. The host is configured to send the first command to the first memory device at a first time, and to send the second command to the second memory device at a second time. The first time and the second time are separated by a delay corresponding to the latency difference.

FIG. 3 is a block diagram schematically illustrating a memory system 300 in accordance with an embodiment of the present technology. The memory system 300 includes a host 310 (e.g., a mobile phone, tablet, digital reader, digital media player, computer, appliance or the like) operably coupled by a shared memory bus 320 to both a first memory device 330 and a second memory device 340. The first and second memory devices 330 and 340 can have different latencies in response to memory commands. For example, the first and second memory devices 330 and 340 may both be NVDIMMs with the same 20 ns latency in response to a status command, and the same 15 ns latency in response to a termination command. Alternatively, the first and second memory devices 330 and 340 may be different memory modules (e.g., one DIMM and one NVDIMM) with different latencies in response to a termination command, and/or different latencies in response to a read/status command. To accommodate the different latencies of the first and second memory devices 330 and 340, the host 310 is configured to send a first command to the first memory device 330 at a first time, and to send a second command to the second memory device 340 at a second time, where the first time and the second time are separated by a delay corresponding to the latency difference between the responses of the first and second memory devices 330 and 340 to the first and second commands, respectively.

FIG. 4 is a timing diagram 400 illustrating this approach to synchronizing memory operations in a memory system with memory devices having different latencies in accordance with an embodiment of the present technology. As can be seen with reference to FIG. 4, in a memory system in which the memory devices on a shared memory bus have different latencies, multiple commands separated by a delay corresponding to a latency difference between the memory devices can be used to synchronize the operations of the memory devices. In this regard, a first command (e.g., a first read command 402) can be issued at a first time on the CA bus 405, to command a first memory device (e.g., with a target signal 415 on the chip select line 410 of the first memory device) to perform a data transfer operation. A second command (e.g., a second read command 404) can be issued at a second time on the CA bus 405, to command a second memory device (e.g., with a non-target signal 425 on the chip select line 420 of the second memory device) to enter a termination mode (e.g., an ODT mode). A delay between the first and second commands 402 and 404 (e.g., the 5 ns illustrated in timing diagram 400) can correspond to the latency difference between the latencies of the first and second memory devices. Accordingly, both the read operation at the first memory device and the ODT mode at the second memory device will occur at the same time (e.g., a third time separated from the first time at which the first command was issued by the first latency, and separated from the second time at which the second command was issued by the second latency).

According to one aspect of the present technology, a connected host device can determine the latencies of each memory device in response to different commands in a variety of ways. For example, the host device can poll the memory devices to determine the latency of each memory device in response to each memory command (e.g., where the memory devices are configured to respond to such a polling request with their predetermined latencies). Alternatively, the host device can test each memory device by issuing memory commands to the memory device and measuring the delay in response to each memory command.

Although in the foregoing embodiment, the two commands (e.g., read command 402 and read command 404) issued to the first and second memory devices utilize the same command on the CA bus 405, and utilize different chip select signals to indicate different command interpretations to the first and second memory devices, in other embodiments, different commands may be issued on the CA bus 405 to the memory devices. In this regard, the current approach to synchronization of memory operations is not limited to synchronizing a termination mode with a data transfer operation. Rather, any two or more memory operations that require synchronization (e.g., execution at a same time, or even execution at predetermined different times) can benefit from the foregoing approach of spacing commands in a time domain by a delay corresponding to a difference in latencies in response to the commands between the targeted memory devices.

Although in the foregoing embodiments, memory systems comprising two memory devices with different latencies are described, the present technology has application to memory systems with more than two memory devices. For example, the foregoing approach to synchronizing memory operations could be applied to a memory system having three or more memory devices, of two different types (e.g., two NVDIMMs and one DIMM, three DIMMs and one NVDIMM, two DIMMs with a first set of a latencies, and two DIMMs with a second set of latencies, etc.). Alternatively, the foregoing approach to synchronizing memory operations could be applied to a memory system having three or more memory devices, of more than two different types (e.g., three DIMMs each having a different set of latencies, four NVDIMMs, each having a different set of latencies, a mixture of DIMMs and NVDIMMs with various latencies, etc.).

Moreover, although the foregoing embodiments have described memory systems with reference to memory modules such as DIMMs and NVDIMMs, those skilled in the art will readily appreciate that the present technology has application to memory systems with other kinds of memory devices, in any one of a number of formats (e.g., other than in-line memory modules). For example, memory systems including a number of different memory devices, including bare memory dies, memory packages, removably-attached memory cards or drives, etc., could benefit from the application of the foregoing approach to synchronizing memory operations.

Moreover, other embodiments of the present technology can involve providing operation commands with delay offsets that have application to systems other than memory systems. In this regard, the foregoing approach of providing operation commands with delay offsets can apply to any general purpose data interface shared by one or more responding devices, such as accelerators sharing a channel, or data buffers on one or more memory modules (e.g., LRDIMMs).

FIG. 5 is a flow chart illustrating a method of operating a memory system in accordance with an embodiment of the present technology. The memory system includes a first memory device having a first latency corresponding to a first command and a second memory device having a second latency corresponding to a second command, wherein the first latency differs from the second latency by a latency difference. The method includes polling the first and second memory devices to determine the first and second latencies (box 510). The method further includes sending the first command to the first memory device at a first time (box 520) and sending a second command to the second memory device at a second time, wherein the first time and the second time are separated by a delay corresponding to the latency difference (box 530). The method further includes the first memory device performing a first operation corresponding to the first command at a third time (box 540) and the second memory device performing a second operation corresponding to the second command at the third time (box 550).

From the foregoing, it will be appreciated that specific embodiments of the invention have been described herein for purposes of illustration, but that various modifications may be made without deviating from the scope of the invention. Accordingly, the invention is not limited except as by the appended claims.

We claim:

1. A memory system, comprising:
   a first memory device having a first latency corresponding to a first command;
   a second memory device having a second latency corresponding to a second command,
       wherein the second latency differs from the first latency by a latency difference; and
   a host operably coupled to the first and second memory devices, and configured to:
       send the first command to the first memory device at a first time, and
       send the second command to the second memory device at a second time,
   wherein the first time and the second time are separated by a delay corresponding to the latency difference,
   wherein in response to the first command, the first memory device performs a first operation at a third time, and
   wherein in response to the second command, the second memory device performs a second operation at the third time.

2. The memory system of claim 1, wherein the third time differs from the first time by the first latency, and from the second time by the second latency.

3. The memory system of claim 1, wherein the host is further configured to:
   poll the first and second memory devices to determine the first and second latencies.

4. The memory system of claim 1, wherein at least one of the first command and the second command is a termination command configured to place one of the first memory device and the second memory device into a termination mode.

5. The memory system of claim 1, wherein at least one of the first command and the second command is a data transfer command configured to place one of the first memory device and the second memory device into a data transfer mode.

6. The memory system of claim 1, wherein the first and second memory devices each comprise one of a DIMM module and an NVDIMM module.

7. The memory system of claim 1, wherein the first and second memory devices are operably coupled to a shared memory bus.

8. A method of operating a memory system including a first memory device having a first latency corresponding to a first command and a second memory device having a second latency corresponding to a second command, wherein the first latency differs from the second latency by a latency difference, the method comprising:
   sending a first command to the first memory device at a first time;
   sending a second command to the second memory device at a second time, wherein the first time and the second time are separated by a delay corresponding to the latency difference;
   the first memory device performing a first operation corresponding to the first command at a third time; and
   the second memory device performing a second operation corresponding to the second command at the third time.

9. The method of claim 8, wherein the third time differs from the first time by the first latency, and from the second time by the second latency.

10. The method of claim 8, further comprising:
    polling the first and second memory devices to determine the first and second latencies.

11. The method of claim 8, wherein at least one of the first command and the second command is a termination command configured to place one of the first memory device and the second memory device into a termination mode.

12. The method of claim 8, wherein at least one of the first command and the second command is a data transfer command configured to place one of the first memory device and the second memory device into a data transfer mode.

13. The method of claim 8, wherein the first and second memory devices each comprise one of a DIMM module and an NVDIMM module.

14. The method of claim 8, wherein the first and second memory devices are operably coupled to a shared memory bus.

* * * * *